United States Patent [19]

Kovacs et al.

[11] Patent Number: 5,355,382
[45] Date of Patent: Oct. 11, 1994

[54] COMPOSITE LASER ARRAY SUPPORT

[75] Inventors: Gregory J. Kovacs, Sunnyvale; Harlan F. Chung, Castro Valley; G. A. Neville Connell, Cupertino; R. Donald Yingling, Jr., late of San Francisco, by David Williamson, executor; Rose M. Donaldson, Santa Clara; Thomas L. Paoli, Los Altos, all of Calif.

[73] Assignee: Xerox Corporation, Stamford, Conn.

[21] Appl. No.: 156,229

[22] Filed: Nov. 22, 1993

[51] Int. Cl.$^5$ .................. H01S 3/04; H01S 3/19
[52] U.S. Cl. .................. 372/36; 372/34; 372/50
[58] Field of Search .................. 372/36, 34, 50

[56] References Cited

U.S. PATENT DOCUMENTS

| | | | |
|---|---|---|---|
| 4,901,325 | 2/1990 | Kato et al. | 372/44 |
| 5,086,431 | 2/1992 | Hardy, Jr. et al. | 372/50 |
| 5,099,488 | 3/1992 | Ahrabi et al. | 372/36 |
| 5,106,429 | 4/1992 | Mundinger et al. | 372/34 |
| 5,305,344 | 4/1994 | Patel | 372/50 |

*Primary Examiner*—Georgia Y. Epps
*Attorney, Agent, or Firm*—John M. Kelly

[57] ABSTRACT

Nonmonolithic laser arrays having lasing elements mounted on a composite support that enables accurate positioning and separation of the lasing elements, and that enables low thermal, optical, and electrical crosstalk. The support includes a low thermal diffusivity region surrounded by high thermal diffusivity regions which have defined mounting surfaces onto which the lasing elements mount. Heat generated in the lasing elements is conducted away by the high thermal diffusivity regions, while the low thermal diffusivity region reduces thermal cross-talk between the lasing elements. Beneficially, the support assists current flow to (or from) the lasing elements.

20 Claims, 3 Drawing Sheets

COMPOSITE LASER ARRAY SUPPORT

The present invention relates to nonmonolithic laser arrays, their fabrication, and their assembly.

BACKGROUND OF THE PRESENT INVENTION

The performance of many devices, such as laser printers and optical memories, can be improved with laser arrays having independently controlled lasing elements. For example, laser printers which use an array of lasing elements can have higher printing speeds and better spot acuity than printers that use only a single lasing element. In many applications it is important that the array's lasing elements be accurately positioned and oriented.

Monolithic laser arrays usually output light beams with the same wavelength. Typically, that wavelength can only be varied over a small range. However, in some applications, including color printing, it is desirable to output multiple wavelengths that span a wide range; for example, from the infrared through the visible. In color printing this enables one to match the laser output characteristics to photoreceptor response windows, or to separate overlapping laser beams by the use of dichroic filters. In some applications it may be desirable to emit multiple laser beams with different polarizations or spot profiles. Finally, it is almost always desirable to have low electrical, optical, and thermal cross-talk between lasing elements.

As compared to present day monolithic laser arrays, nonmonolithic laser arrays can provide a greater range of laser beam characteristics (such as wavelength and polarization) and have lower electrical, optical, and thermal crosstalk. Thus, nonmonolithic laser arrays are frequently preferred.

A nonmonolithic laser array typically consists of a plurality of individual laser diodes mounted on a support. Since in many applications the output laser beams must be accurately spaced, the supports should enable accurate positioning of the lasing elements, while not detracting from the advantages of nonmonolithic laser arrays.

Prior art nonmonolithic semiconductor laser arrays usually use planar supports. These planar laser arrays have a major problem with how close the emitted laser beams can be spaced. This follows because a lasing element's laser stripe (the source of the laser beam) is generally placed at the center of the lasing element to avoid damage during the cutting of the wafer from which the lasing element is produced. Thus, in the prior art laser stripes could not easily be spaced any closer than the width of a lasing element if they are placed on a common planar substrate.

Kato et al. in U.S. Pat. No. 4,901,325 teach a non-planar nonmonolithic laser array suitable for use with closely spaced lasing elements. A simplified view of that support in a nonmonolithic laser array is shown in FIG. 1. While the support 10 (with a spacer 12) enables the lasing elements 14 to be spaced within microns, absolute control of the lasing element spacing (how close the lasing elements are to their desired location) is not provided for. Further, the orientations of the lasing elements are not rigidly controlled.

Thus, there exists a need for methods and devices that enable close, accurate spacing of lasing elements in a nonmonolithic laser array without excessive thermal, optical, and/or electrical cross-talk. Such methods and devices are even more desirable if they permit the accurate orientation of the lasing elements.

SUMMARY OF THE INVENTION

The present invention provides for nonmonolithic laser arrays comprised of lasing elements mounted on a support that enables accurate positioning and separation of the lasing elements, and that enables low thermal, optical, and electrical cross-talk. While the present invention is usable over a very large range of separations, it is particularly useful when separating lasing elements by less than about 250 microns.

The support is a composite structure having a body from which a spacer protrudes. The support includes a low thermal diffusivity region surrounded by one or more high thermal diffusivity regions which have defined mounting surfaces onto which the lasing elements mount. Thus, the thickness of the spacer controls the horizontal separation of the lasing elements.

If the body and/or the spacer are electrically insulative, an electrically conductive layer can be deposited over one or more of the external surfaces of the body and/or spacer, as required, to enable current flow to the lasing elements. Beneficially, the mounting surfaces of the lasing elements which connect to the support are electrical input terminals. The other terminals of the lasing elements connect via wires to their respective current sources. Thus, the support conducts current for both lasing elements.

Heat generated by current flow through the lasing elements flows down the high thermal diffusivity regions of the spacer and into the body, which is beneficially heatsinked. The low thermal diffusivity region of the spacer provides a thermal barrier which reduces heat flow between the lasing elements. The spacer reduces or eliminates thermal cross-talk between the lasing elements, and also reduces the self-heating of the lasing elements (which causes laser droop).

The support can be shaped to meet its particular application. In many cases the spacer will form a T-shape with the body. In another embodiment, the support has legs formed by a lengthwise slit through the spacer, while the legs have surfaces for receiving a lasing element. The lengthwise slit, which may be filled with a low thermal diffusivity material, forms the heat flow barrier. In another embodiment, the support is an integral unit of a low thermal diffusivity core sandwiched by a high thermal diffusivity material. Generally, the body will be in thermal connection with a heatsink.

BRIEF DESCRIPTION OF THE DRAWINGS

Other aspects of the present invention will become apparent as the following description proceeds and upon reference to the drawings, in which.

The following description makes reference to various directional signals, such as right, left, up, and down, which are taken relative to the drawings. Those signals are meant to aid the understanding of the present invention, not to limit it.

DETAILED DESCRIPTION OF THE ILLUSTRATED EMBODIMENTS

The following text makes reference to the characteristics of thermal diffusivity and thermal conductivity. Thermal diffusivity describes the ability of a material to transfer heat, while thermal conductivity is the product of thermal diffusivity and heat capacity. Since the object of the subsequently described composite structure is to optimize heat transfer away from heat generating lasing elements, thermal diffusivity is the characteristic of most interest.

Figure 1:
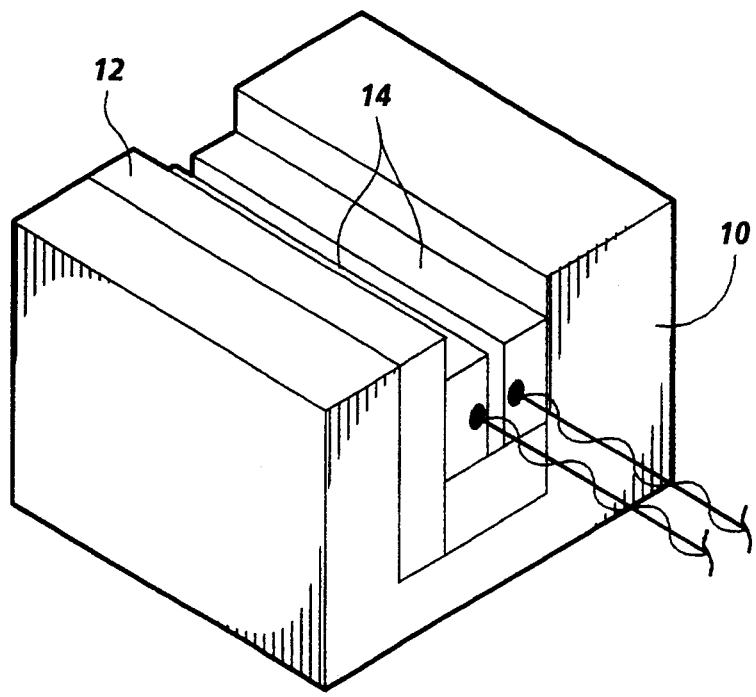
FIG. 1 illustrates a prior art nonmonolithic laser array.
Figure 2:
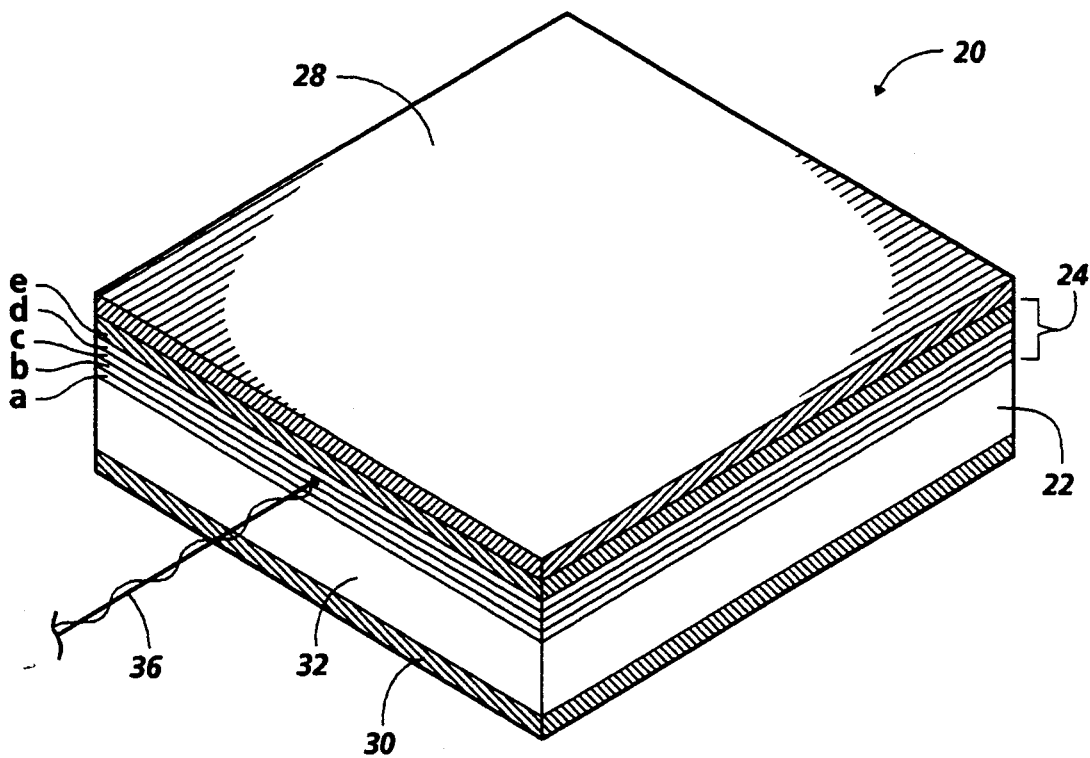
FIG. 2 illustrates a lasing element suitable for use with the various illustrated embodiment nonmonolithic laser arrays.

A typical lasing element used in the subsequently described embodiments is a semiconductor diode laser 20 as illustrated in FIG. 2. The diode laser 20 is comprised of a substrate 22 doped to one electrical type (say n-type) having an overgrown multiple section epitaxial layer 24. The epitaxial layer 24 is comprised of 5 epilayers, 24a through 24e. The layers 24a and 24b are n-type; layers 24d and 24e are p-type; and layer 24c is undoped. The various epilayers serve to confine the recombining carriers and the resulting emitted photons. An electrode layer 28 is formed over the layer 24. The electrode layer 28 can be patterned, or the material in layer 24 can be modified (for example by layer disordering or reverse doping), to confine the input current as required. A second electrode layer 30 is formed over the bottom of the substrate. The diode laser 20 is constructed such that current applied via the electrode layers 28 and 30 causes the diode laser to emit light.

As is well known, diode lasers require optical reflectors, which are usually implemented as cleaved facets, for operation. The optical reflector arrangement for the diode laser 20 is achieved using cleaved end faces 32 (only one of which is shown) which form a cavity for stimulated emission. During lasing, a laser beam 36 is emitted from the end face 32.

To achieve the maximum spacing and positioning accuracy of the laser outputs the lasing elements 20 are mounted on the supports (described below) with the electrode layer 28 in electrical contact with the supports. This is advantageous because the thicknesses of the epilayers 24a through 24e and the thickness of the electrode layer 28 are easier to control than the substrate thickness. Additionally, since the layers 24a through 24e and the layer 28 are very thin (about 2 μm, inclusively), when mounted in this manner the laser beam outputs are very close to the supports. Thus, laser beam separation is essentially equal to the thickness of the support. Finally, mounting the lasing elements in this manner places the heat generating epilayers in good thermal contact with the support, thereby improving heat transfer.

Figure 3:
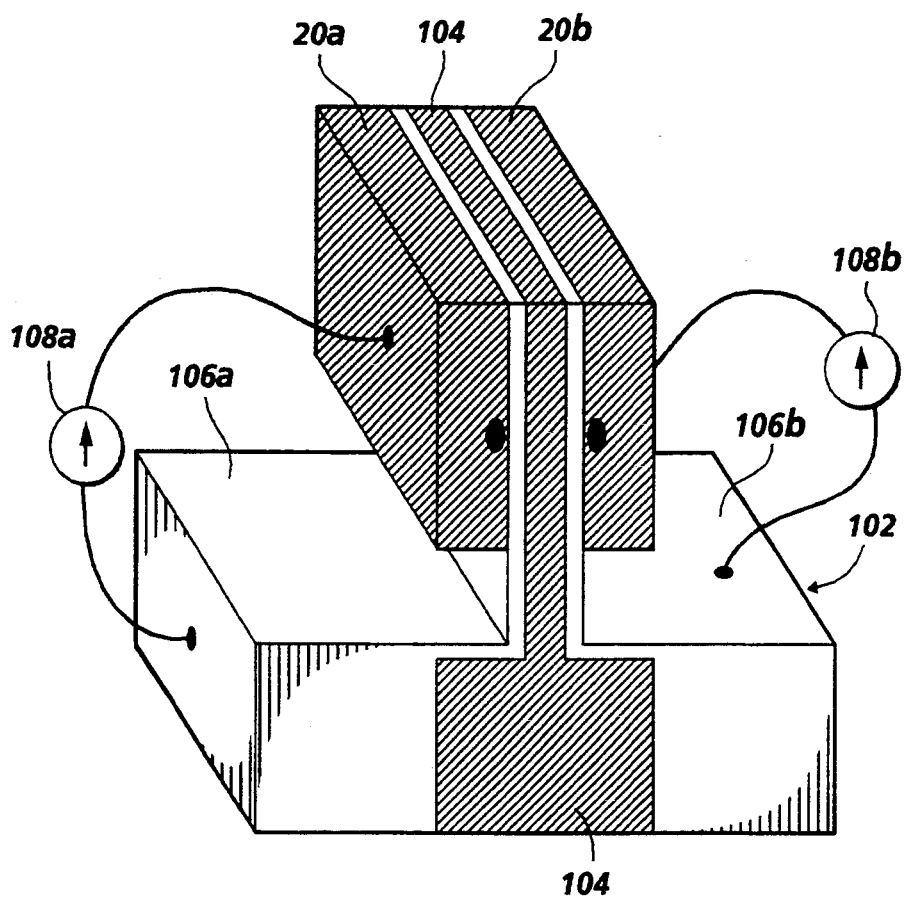
FIG. 3 is a cut-away, perspective view of a first embodiment nonmonolithic laser array according to the principles of the present invention.

Referring now to FIG. 3, nonmonolithic laser arrays according to a first embodiment of the present invention have two lasing elements 20, designated 20a and 20b, mounted on a support 102. The support 102 is a T-shaped composite structure comprised of a low thermal diffusivity core 104 surrounded by a high thermal diffusivity portion 106, which is electrically conductive (shown as portions 106a and 106b in FIG. 3). The lasing elements are mounted such that 1) they are in thermal contact with the support, and 2) their electrode layers 28 are in electrical contact with the high thermal diffusivity portion 106 (as described above). Illustratively, the core may be silicon while the high thermal diffusivity portion 106 may be copper, gold, or aluminum.

In operation, electrical currents from current sources 108a and 108b are applied to the lasing elements 20a and 20b, respectively. The high thermal diffusivity portion 106 serves as a common conductor for both current sources. Considering now only lasing element 20a, current from the current source 108a is applied to the conductive layer 30 (see FIG. 2), passes through the lasing element 20a, causing it to emit light, flows from the lasing element 20a via the electrode layers 28 into and down the support 102, flows through the support, and returns to the current source 108a. The lasing element 20b operates similarly with respect to current source 108b.

Current flow through the lasing elements generates heat. That heat flows down the high thermal diffusivity portion 106, cooling the lasing elements. This reduces laser droop and the chances of thermal run-away. Heat flowing through the high thermal diffusivity portion 106 is readily removed by proper heatsinking. The low thermal diffusivity core 104 provides a thermal barrier which reduces heat flow between the lasing elements, and thus reduces thermal cross-talk.

As all of the other described embodiments (below) electrically and thermally operate similarly, the above descriptions of electrical and thermal operations will not be repeated.

Figure 4:
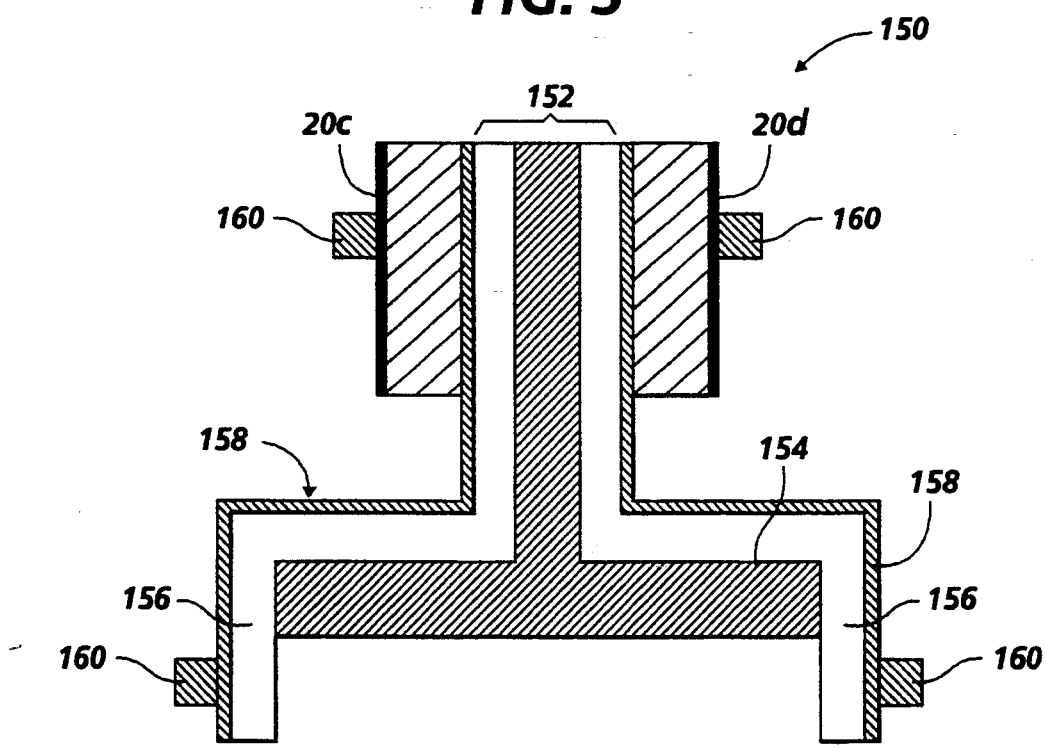
FIG. 4 is a cut-away plan view of a second embodiment nonmonolithic laser array according to the principles of the present invention.

The principles of the inventive nonmonolithic laser array may be practiced in many other embodiments than that shown in FIG. 3. For example, FIG. 4 shows an alternative embodiment nonmonolithic laser array 150 which might be highly desirable in a specific application. The laser array 150 has two lasing elements 20, designated 20c and 20d mounted on a high thermal diffusivity support 152. The support 152 is comprised of a silicon inner core 154 surrounded by a diamond outer core 156. As diamond is electrically insulative, to provide a current path for the lasing elements 20c and 20d, a conductive layer 158 is deposited over at least part of the outer core 156. Wires 160 connect the lasing elements and the conductive layer 158 to current sources (not shown in FIG. 4). The diamond/silicon composite structure makes a very effective support structure.

Figure 5:
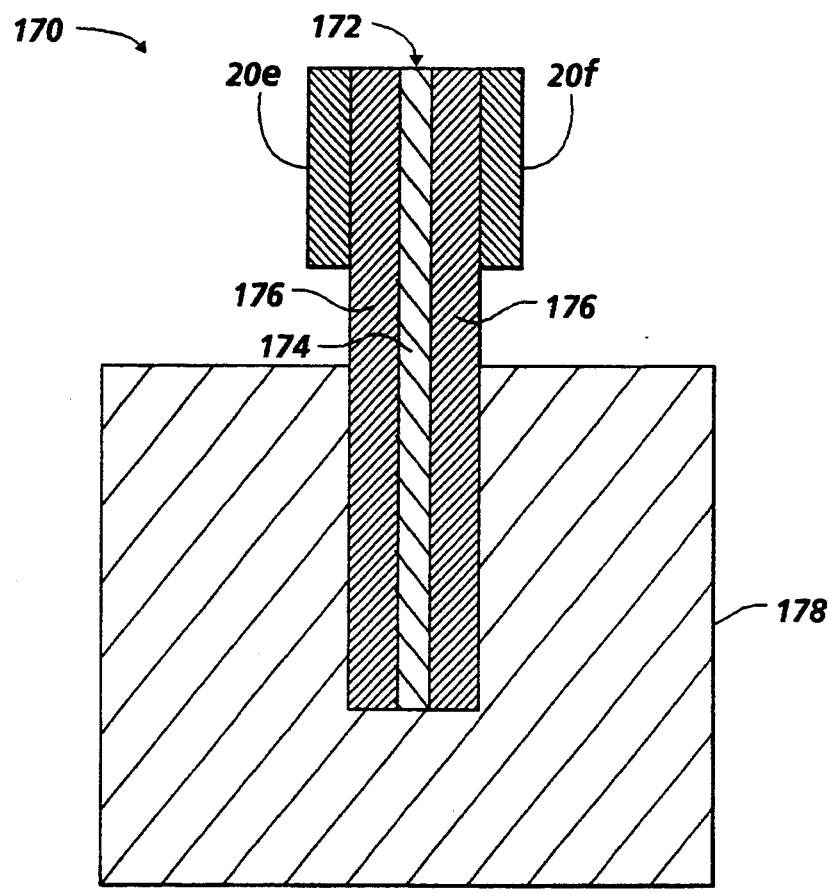
FIG. 5 is a cut-away plan view of a third embodiment nonmonolithic laser array according to the principles of the present invention.

An alternative nonmonolithic laser array 170, similar to the structure shown in FIG. 4, is shown in FIG. 5. The laser array 170 is comprised of two lasing elements 20, designated 20e and 20f mounted on a high thermal diffusivity composite sheet 172. The composite sheet is comprised of a silicon core 174 sandwiched between diamond sheets 176 which have a thin electrically conductive layer over their outside surfaces. As in FIG. 4, the lasing elements mount in electrical contact with the thin electrically conductive layer, and in thermal contact with the diamond sheets. A copper heatsink 178 provides a thermal sink for the composite sheet 172.

Figure 6:
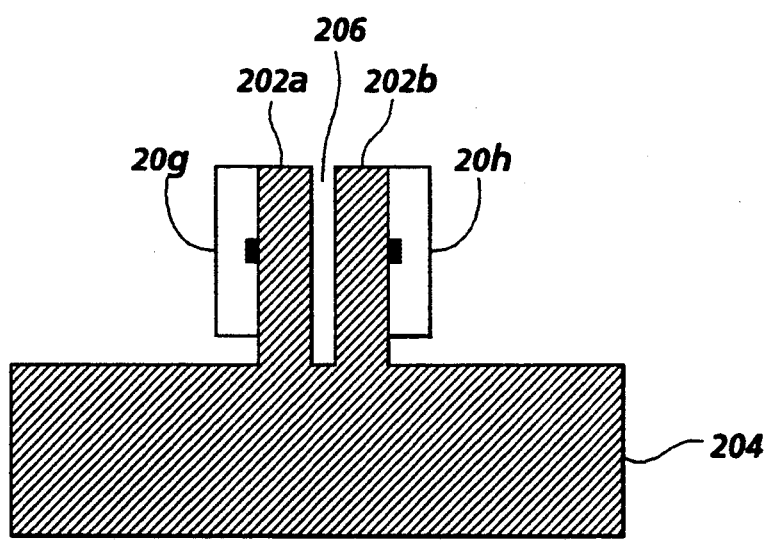
FIG. 6 is a cut-away plan view of a fourth embodiment nonmonolithic laser array according to the principles of the present invention.

Yet another nonmonolithic laser array 200 is shown in FIG. 6. The laser array 200 is comprised of two lasing elements 20, designated 20g and 20h, mounted on legs 202a and 202b, respectively, of a support 204. Between the legs is a gap 206 that may be filled with a low thermal diffusivity material.

While the variously depicted embodiments work over a wide range of lasing element separations, they are particularly useful when the separation is less than about 250 μm. This is because as the separation decreases, the need for thermal insulation between the lasing elements increases.

The materials comprising the various elements of the specific embodiment being implemented should be selected to accomplish the goals of that specific element.

A useful table for selecting materials via their thermal properties is:

| Thermal Properties of Various Materials at 300 K. | | | |
|---|---|---|---|
| Material | Heat Capacity (J/cm$^3$/°K.) | Thermal Conductivity (W/cm/°K.) | Diffusivity (cm$^2$/sec) |
| Al | 2.43 | 2.37 | 0.98 |
| Cu | 3.43 | 3.98 | 1.16 |
| Au | 2.48 | 3.15 | 1.27 |
| Pt | 2.84 | 0.73 | 0.26 |
| Ag | 2.48 | 4.27 | 1.72 |
| Si | 1.63 | 1.41 | 0.86 |
| Diamond (CVD) | 1.82 | 12.00 | 6.59 |
| Diamond (Type IIa) | 1.82 | 20.00 | 10.99 |
| Ni | 3.94 | 0.63 | 0.16 |
| Sn | 1.25 | 0.73 | 0.59 |
| In | 1.71 | 0.86 | 0.50 |

The various embodiments can be fabricated in many ways. For example, a high thermal diffusivity material can be coated on a low thermal diffusivity material; a high thermal diffusivity material can be bonded (say with epoxy) onto a low thermal diffusivity material; or two high thermal diffusivity layers can be physically separated by air or by a low thermal diffusivity material (as in FIG. 6).

Coatings of high thermal diffusivity materials on low thermal diffusivity materials can be accomplished in several ways, such as electroplating or electrodeposition, evaporation, or sputtering of metals, or by material growth, such as CVD diamond growth on silicon, nickel or platinum. When using electroplating, the process must be done under conditions which yield a compact film free of voids. Copper, silver and gold have been electroplated successfully onto silicon T shapes to thicknesses of 10 μm (deposition time of about 48 minutes).

If electrodepositing metal onto a silicon T shaped submount (reference FIG. 4), deposition is best performed after the submount is soldered to a copper heat sink using a solder such as Sn:Ag - 95:5. Presently, the bottom of the inverted T is prepared for soldering using evaporated Cr:Au. The sides of the silicon T are then coated with sputtered Ni:Pt. Electrodeposition is then performed, followed by sputtering a thin Ni:Pt layer on the inverted silicon T. Finally, In (Indium) is evaporated onto the silicon T. Electroless catalytic metal coatings might also be usable in fabricating the high thermal diffusivity elements. CVD diamond grown directly on silicon submounts is also possible.

It is also possible to solder the various elements together. If solder is used, it is beneficial to use a high melting temperature solder, such as In-Sn, to avoid problems when the lasing elements are soldered in place (see below).

Attachment of the lasing elements to the various supports is best performed using a low temperature solder, such as In. First, prior to soldering, the indium pellets used for soldering are immersed in a dilute hydrochloric acid solution for oxide removal. Then, the spacer's mounting surfaces are prepared for soldering by sputter deposition of a thin layer of nickel, followed by a thin layer of platinum. Solder is then deposited onto the spacers using thermal evaporation of the indium pellets from tungsten boats. The objective is to deposit a film that is thick enough for planarization and wetting, but thin enough to allow insignificant material flow. A good In film thickness is around 2-2.5 μm. Next, the lasing elements are brought into close proximity with the indium layer on the spacer and aligned. Then, using visual observation, the temperature of the spacer is raised above the melting temperature of the indium solder and the lasing elements 20 are pressed into place using a vacuum collet. The vacuum is then released, but physical pressure with the collet is maintained. The heating source is then turned off and a cooling nitrogen gas stream is applied to the lasing element. When the solder has solidified the pressure on the lasing element is released. Cooling to room temperature then continues.

The soldering procedure described above can be modified to fit the particular application and materials. However, in all cases surface preparation should be performed carefully to ensure good, reliable thermal and electrical connections.

From the foregoing, numerous modifications and variations of the principles of the present invention will be obvious to those skilled in its art. Therefore the scope of the present invention is to be defined by the appended claims.

What is claimed:

1. A laser array comprising:
    a composite support comprised of an electrically conductive high thermal diffusivity region that includes at least two mounting surfaces, and of a low thermal diffusivity region that is at least partially disposed between said mounting surfaces; and
    at least two lasing elements, each mounted on an associated one of said mounting surfaces such that the separation between said lasing elements is controlled by the thicknesses of said high thermal diffusivity region and by the thickness of the portion of said low thermal diffusivity region that is disposed between said mounting surfaces, said lasing elements being in electrical and thermal contact with their associated mounting surfaces;
    wherein said low thermal diffusivity region impedes heat flow between said lasing elements when at least one of said lasing elements emits light, and wherein said high thermal diffusivity region conducts heat generated in said light emitting lasing element away from said light emitting lasing element.

2. The laser array according to claim 1, further including at least two sources of electrical current, each electrically connected between a single one of said lasing elements and that lasing element's associated mounting surface.

3. The laser array according to claim 1, further including a heatsink in thermal contact with said high thermal diffusivity region.

4. A laser array comprising:
    a composite support comprised of a high thermal diffusivity region having two electrically conductive surfaces, said support further having a low thermal diffusivity region that is at least partially disposed between said surfaces; and at least two lasing elements, each mounted on an associated one of said surfaces such that the separation between said lasing elements is controlled by the thicknesses of said high thermal diffusivity region and by the thickness of the portion of said low thermal diffusivity region that is disposed between said high thermal diffusivity region, said lasing elements being in electrical and thermal contact with said electrically conductive surfaces;

wherein said low thermal diffusivity region impedes heat flow between said lasing elements when at least one of said lasing elements emits light, and wherein said high thermal diffusivity region conducts heat generated in said light emitting lasing element away from said light emitting lasing element.

5. The laser array according to claim 4, further including a heatsink in thermal contact with said high thermal diffusivity region.

6. The laser array according to claim 4, further including at least two sources of electrical current, each electrically connected between an associated one of said lasing elements and that lasing element's conductive surface.

7. A laser array comprising:

a high thermal diffusivity support having a base from which two legs separated by a gap protrude, each of said legs having an external surface capable of conducting current; and at least two lasing elements, each mounted on an individual associated leg, and such that each lasing element is in electrical and thermal contact with the external surface of its associated leg, and such that the separation of said two lasing elements is controlled by the width of both of said legs and by the width of said gap;

wherein said gap impedes heat flow between said lasing elements when one of said lasing elements emits light, and wherein said leg associated with said light emitting lasing element conducts heat generated in said light emitting lasing element away from said light emitting lasing element.

8. The laser array according to claim 7, wherein an electrically conductive layer over at least part of said high thermal diffusivity support provides said external surfaces capability of conducting current, and wherein said lasing elements are in electrical contact with said conductive layer.

9. The laser array according to claim 8, wherein said gap is filled with a low thermal diffusivity material.

10. The laser array according to claim 7, wherein said gap is filled with a low thermal diffusivity material.

11. A laser array comprising:

a composite support comprised of a high thermal diffusivity material that forms a first region having at least two surfaces, and of a low thermal diffusivity material that forms a second region that is at least partially disposed between said surfaces; and at least two lasing elements, each in thermal contact with one of said surfaces such that the separation between said lasing elements is controlled by the thicknesses of said first region and by the thickness of said second region that is disposed between said surfaces;

wherein said low thermal diffusivity material impedes heat flow between said lasing elements when at least one of said lasing elements emits light, and wherein said high thermal diffusivity material conducts heat generated in said light emitting lasing element away from said light emitting lasing element.

12. The laser array according to claim 11, wherein said high thermal diffusivity material is comprised of diamond.

13. The laser array according to claim 12, wherein said low thermal diffusivity material is comprised of silicon.

14. The laser array according to claim 11, wherein said high thermal diffusivity material is comprised of copper.

15. The laser array according to claim 14, wherein said low thermal diffusivity material is comprised of silicon.

16. The laser array according to claim 11, wherein said high thermal diffusivity material is comprised of gold.

17. The laser array according to claim 16, wherein said low thermal diffusivity material is comprised of silicon.

18. The laser array according to claim 11, wherein said high thermal diffusivity material is comprised of silver.

19. The laser array according to claim 18, wherein said low thermal diffusivity material is comprised of silicon.

20. The laser array according to claim 11, wherein said low thermal diffusivity material is comprised of silicon.

* * * * *